United States Patent
Machinaga et al.

(10) Patent No.: US 11,991,871 B2
(45) Date of Patent: May 21, 2024

(54) IMPEDANCE MATCHING FILM FOR RADIO WAVE ABSORBER, IMPEDANCE MATCHING FILM-ATTACHED FILM FOR RADIO WAVE ABSORBER, RADIO WAVE ABSORBER, AND LAMINATE FOR RADIO WAVE ABSORBER

(71) Applicant: NITTO DENKO CORPORATION, Ibaraki (JP)

(72) Inventors: Hironobu Machinaga, Osaka (JP); Motoki Haishi, Osaka (JP); Yosuke Nakanishi, Osaka (JP); Yuuki Takeda, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 441 days.

(21) Appl. No.: 17/299,398

(22) PCT Filed: Dec. 11, 2019

(86) PCT No.: PCT/JP2019/048575
§ 371 (c)(1),
(2) Date: Jun. 3, 2021

(87) PCT Pub. No.: WO2020/122150
PCT Pub. Date: Jun. 18, 2020

(65) Prior Publication Data
US 2022/0053675 A1    Feb. 17, 2022

(30) Foreign Application Priority Data
Dec. 12, 2018   (JP) .................................. 2018-233000

(51) Int. Cl.
*B32B 15/08*    (2006.01)
*B32B 7/12*     (2006.01)
(Continued)

(52) U.S. Cl.
CPC ............. *H05K 9/0081* (2013.01); *B32B 7/12* (2013.01); *B32B 15/08* (2013.01); *H01Q 15/141* (2013.01);
(Continued)

(58) Field of Classification Search
CPC . B32B 15/08; B32B 2250/02; B32B 2250/03; B32B 2250/04; B32B 2250/24;
(Continued)

(56) References Cited

U.S. PATENT DOCUMENTS 9,000,869 B2 * 4/2015 McKinzie, III ......... H01P 1/163
                                                         333/175
9,999,158 B2 * 6/2018 Misra ..................... H05K 9/003
(Continued)

FOREIGN PATENT DOCUMENTS

EP    3267775 A1    1/2018
JP    9-286070 A    11/1997
(Continued)

OTHER PUBLICATIONS

The Extended European Search Report dated Sep. 1, 2022, issued counterpart to EP Application No. 19896828.1. (17 pages).
(Continued)

*Primary Examiner* — Timothy A Brainard
(74) *Attorney, Agent, or Firm* — WHDA, LLP (57) ABSTRACT

An impedance matching film 10 includes a mixture containing indium oxide and tin oxide and being a main component of the impedance matching film, the mixture having an amorphous structure. The impedance matching film 10 for impedance matching has a Hall mobility of 5 $cm^2/(V \cdot s)$ or more. The impedance matching film 10 has a thickness of 16 nm or more and less than 100 nm.

12 Claims, 5 Drawing Sheets

(51) Int. Cl.
*H01Q 15/14* (2006.01)
*H01Q 17/00* (2006.01)
*H05K 9/00* (2006.01)

(52) U.S. Cl.
CPC ...... *H01Q 17/008* (2013.01); *B32B 2264/102* (2013.01); *B32B 2307/202* (2013.01); *B32B 2307/204* (2013.01); *B32B 2307/212* (2013.01); *B32B 2457/00* (2013.01)

(58) Field of Classification Search
CPC ............ B32B 2255/10; B32B 2255/20; B32B 2255/205; B32B 2264/102; B32B 2307/20; B32B 2307/202; B32B 2307/204; B32B 2307/212; B32B 2307/306; B32B 2307/416; B32B 2307/546; B32B 2307/714; B32B 2307/732; B32B 2307/734; B32B 2307/748; B32B 2457/00; B32B 27/08; B32B 27/281; B32B 27/283; B32B 27/304; B32B 27/306; B32B 27/308; B32B 27/32; B32B 27/325; B32B 27/36; B32B 27/365; B32B 27/40; B32B 7/02; B32B 7/06; B32B 7/12; H01Q 15/141; H01Q 17/00; H01Q 17/008; H05K 9/0081; H05K 9/0084; H05K 9/0088; H05K 9/0094

See application file for complete search history.

(56) References Cited

U.S. PATENT DOCUMENTS

| | | |
|---|---|---|
| 2001/0019244 A1 | 9/2001 | Yamazaki et al. |
| 2005/0142033 A1* | 6/2005 | Glezer .................. B01L 3/5085 422/400 |
| 2016/0160345 A1* | 6/2016 | Miyamoto ............... B32B 9/00 428/480 |
| 2018/0070483 A1* | 3/2018 | Ohishi ............... G06K 7/10415 |
| 2019/0380232 A1 | 12/2019 | Machinaga et al. |
| 2021/0265738 A1* | 8/2021 | Mutou ..................... B32B 5/32 |
| 2022/0039302 A1* | 2/2022 | Haishi .................. H05K 9/0088 |

FOREIGN PATENT DOCUMENTS

| | | |
|---|---|---|
| JP | 2018-056562 A | 4/2018 |
| JP | 2018-098367 A | 6/2018 |
| JP | 2018-147999 A | 9/2018 |
| WO | 2015/037182 A1 | 3/2015 |
| WO | 2017/057556 A1 | 4/2017 |
| WO | 2020/066945 A1 | 4/2020 |

OTHER PUBLICATIONS

International Search Report dated Mar. 10, 2020, issued in counterpart application No. PCT/JP2019/048575, w/ English translation (4 pages).

Written Opinion dated Mar. 10, 2020, issued in counterpart application No. PCT/JP2019/048575, w/English translation (11 pages).

* cited by examiner

IMPEDANCE MATCHING FILM FOR RADIO WAVE ABSORBER, IMPEDANCE MATCHING FILM-ATTACHED FILM FOR RADIO WAVE ABSORBER, RADIO WAVE ABSORBER, AND LAMINATE FOR RADIO WAVE ABSORBER

TECHNICAL FIELD

The present invention relates to an impedance matching film for a radio wave absorber, an impedance matching film-attached film for a radio wave absorber, a radio wave absorber, and a laminate for a radio wave absorber.

BACKGROUND ART

A technique using a material, such as indium tin oxide (ITO), containing indium oxide and tin oxide for impedance matching has been conventionally known.

For example, according to the description in Patent Literature 1, conventional λ/4 radio wave absorbers have a structure in which ITO as a resistance film, a dielectric layer, and an electrically conductive layer are laminated. In such λ/4 radio wave absorbers, the ITO as a resistance film is included for impedance matching. According to Patent Literature 1, it is pointed out that an amorphous ITO film has low durability in air. Therefore, Patent Literature 1 proposes, for manufacturing a λ/4 radio wave absorber having excellent durability, a resistance film for a λ/4 radio wave absorber, the resistance film being made of an alloy including 5 weight % or more of molybdenum.

CITATION LIST

Patent Literature

Patent Literature 1: JP 2018-056562 A

SUMMARY OF INVENTION

Technical Problem

Patent Literature 1 neither states nor suggests that the durability of λ/4 radio wave absorbers can be increased using an amorphous ITO film as the resistance film. Moreover, the durability of the resistance film exposed to a high-temperature environment (for example, an environment of 125° C.) for a long period of time is not evaluated in Patent Literature 1.

In view of such circumstances, the present invention provides an impedance matching film for a radio wave absorber, the impedance matching film including a mixture containing indium oxide and tin oxide and being a main component of the impedance matching film, the mixture having an amorphous structure, the impedance matching film being advantageous in maintaining a characteristic desirable in terms of impedance matching when exposed to a high temperature atmosphere for a long period of time. The present invention also provides a radio wave absorber including such an impedance matching film and a laminate for a radio wave absorber, the laminate including such an impedance matching film.

Solution to Problem

The present invention provides an impedance matching film for a radio wave absorber, including: a mixture containing indium oxide and tin oxide and being a main component of the impedance matching film, the mixture having an amorphous structure, wherein the impedance matching film has a Hall mobility of 5 $cm^2/(V·s)$ or more, and the impedance matching film has a thickness of 16 nm or more and less than 100 nm.

The present invention also provides an impedance matching film-attached film for a radio wave absorber, including:
a substrate; and
the above impedance matching film.

The present invention also provides a radio wave absorber, including:
the above impedance matching film;
an electrical conductor that reflects a radio wave; and
a dielectric layer disposed between the impedance matching film and the electrical conductor in a thickness direction of the impedance matching film.

The present invention also provides a laminate for a radio wave absorber, including:
the above impedance matching film; and
a dielectric layer disposed in contact with the impedance matching film in a thickness direction of the impedance matching film.

Advantageous Effects of Invention

The above impedance matching film for a radio wave absorber is advantageous in maintaining the characteristic desirable in terms of impedance matching when exposed to a high-temperature environment for a long period of time.

DESCRIPTION OF EMBODIMENTS

Hereinafter, embodiments of the present invention will be described with reference to the drawings. The present invention is not limited to the following embodiments.

Figure 1:
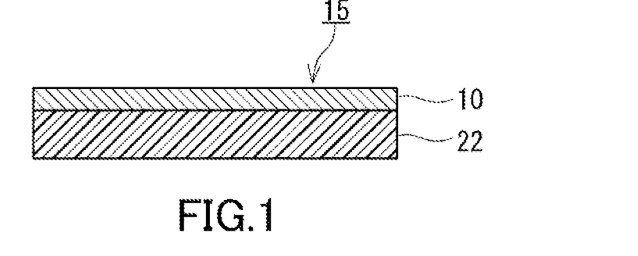
FIG. 1 is a cross-sectional view showing an example of an impedance matching film for a radio wave absorber according to the present invention.

As shown in FIG. 1, an impedance matching film 10 for a radio wave absorber is provided, for example, in the form of an impedance matching film-attached film 15 for a radio wave absorber. The impedance matching film 10 for a radio wave absorber is a resistive film. The impedance matching film-attached film 15 for a radio wave absorber includes a substrate 22 and the impedance matching film 10 for a radio wave absorber. The impedance matching film 10 for a radio wave absorber is formed, for example, on one principal surface of the substrate 22. The impedance matching film 10 includes a mixture containing indium oxide and tin oxide and being a main component of the impedance matching film 10. The mixture has an amorphous structure. The impedance matching film 10 has a Hall mobility of 5 $cm^2/(V \cdot s)$ or more. The Hall mobility of the impedance matching film 10 can be determined by Hall effect measurement of the impedance matching film 10. The Hall effect measurement of the impedance matching film 10 is performed, for example, according to the van der Pauw method. The impedance matching film 10 has a thickness of 16 nm or more and less than 100 nm. The term "main component" as used herein refers to a component whose content is highest on a mass basis. The main component can be, for example, a component accounting for more than 50 mass %. The mixture containing indium oxide and tin oxide is present, for example, as a solid solution.

The impedance matching film 10 having a Hall mobility of 5 $cm^2/(V \cdot s)$ or more is likely to maintain the characteristic desirable in terms of impedance matching when exposed to a high-temperature environment (for example, 125° C.) for a long period of time (for example, 1000 hours). Through a lot of trial and error, the present inventors have newly found that by adjusting the Hall mobility in the above range, the impedance matching film including the mixture containing indium oxide and tin oxide and being the main component of the impedance matching film, the mixture having an amorphous structure, can maintain the characteristic desirable in terms of impedance matching when exposed to a high-temperature environment for a long period of time.

It is unclear why the impedance matching film 10 having a Hall mobility of 5 $cm^2/(V \cdot s)$ or more can maintain the characteristic desirable in terms of impedance matching when exposed to a high-temperature environment for a long period of time. The present inventors think that the reason is as follows. In a film including the mixture containing indium oxide and tin oxide and being the main component of the film, the mixture having an amorphous structure, an oxygen vacancy is considered to be a source of a carrier. It is thought that a high density of oxygen vacancies in such a film is likely to result in an oxidation reaction in a high-temperature environment and an increase in the mobility of the film. It is thought that when the impedance matching film 10 has a Hall mobility in the range of 5 $cm^2/(V \cdot s)$ or more, oxygen vacancies are present at an appropriate density in the impedance matching film 10 and the Hall mobility and carrier density of the impedance matching film 10 are unlikely to vary in a high-temperature environment. This is thought to allow the impedance matching film 10 to maintain the characteristic desirable in terms of impedance matching when exposed to a high-temperature environment for a long period of time.

The Hall mobility of the impedance matching film 10 is not limited to a particular value as long as the hall mobility thereof is in the above range. The Hall mobility of the impedance matching film 10 may be 6 $cm^2/(V \cdot s)$ or more, 7 $cm^2/(V \cdot s)$ or more, 8 $cm^2/(V \cdot s)$ or more, 9 $cm^2/(V \cdot s)$ or more, 10 $cm^2/(V \cdot s)$ or more, 15 $cm^2/(V \cdot s)$ or more, or 20 $cm^2/(V \cdot s)$ or more. The Hall mobility of the impedance matching film 10 is, for example, 65 $cm^2/(V \cdot s)$ or less, and may be 60 $cm^2/(V \cdot s)$ or less, 58 $cm^2/(V \cdot s)$ or less, 55 $cm^2/(V \cdot s)$ or less, 52 $cm^2/(V \cdot s)$ or less, 51 $cm^2/(V \cdot s)$ or less, 50 $cm^2/(V \cdot s)$ or less, 49 $cm^2/(V \cdot s)$ or less, 48 $cm^2/(V \cdot s)$ or less, 47 $cm^2/(V \cdot s)$ or less, 46 $cm^2/(V \cdot s)$ or less, 45 $cm^2/(V \cdot s)$ or less, 40 $cm^2/(V \cdot s)$ or less, or 35 $cm^2/(V \cdot s)$ or less.

The Hall mobility of the impedance matching film 10 is desirably 50 $cm^2/(V \cdot s)$ or less. In this case, it is thought that oxygen vacancies are more reliably present at an appropriate density in the impedance matching film 10 and the Hall mobility and carrier density of the impedance matching film 10 are unlikely to vary in a high-temperature environment. This allows the impedance matching film 10 to more reliably maintain the characteristic desirable in terms of impedance matching when exposed to a high-temperature environment for a long period of time.

Since the impedance matching film 10 has a thickness of less than 100 nm, warping thereof can be reduced. Additionally, the impedance matching film 10 is less likely to crack. Moreover, since having a thickness of 16 nm or more and less than 100 nm, the impedance matching film 10 including the mixture containing indium oxide and tin oxide and being the main component is likely to have a desired sheet resistance. Furthermore, since having a thickness of 16 nm or more and less than 100 nm, the impedance matching film 10 is also advantageous in terms of productivity and manufacturing cost.

The thickness of the impedance matching film 10 may be 18 nm or more, 20 nm or more, 25 nm or more, or 30 nm or more. The thickness of the impedance matching film 10 may be 90 nm or less, 80 nm or less, 70 nm or less, or 60 nm or less.

The impedance matching film 10 has a specific resistance of, for example, $0.5 \times 10^{-3}$ to $5.0 \times 10^{-3}$ $\Omega \cdot cm$. This makes it likely that the impedance matching film 10 has the characteristic desirable in terms of impedance matching. Since the main component of the impedance matching film 10 has an amorphous structure, the specific resistance of the impedance matching film 10 is likely to fall within such a range. The specific resistance of the impedance matching film 10 may be $0.7 \times 10^{-3}$ $\Omega \cdot cm$ or more, $0.8 \times 10^{-3}$ $\Omega \cdot cm$ or more, or $1.0 \times 10^{-3}$ $\Omega \cdot cm$ or more. The specific resistance of the impedance matching film 10 may be $4.8 \times 10^{-3}$ $\Omega \cdot cm$ or less, $4.5 \times 10^{-3}$ $\Omega \cdot cm$ or less, $4.0 \times 10^{-3}$ $\Omega \cdot cm$ or less, $3.5 \times 10^{-3}$ $\Omega \cdot cm$ or less, or $3.3 \times 10^{-3}$ $\Omega \cdot cm$ or less.

The impedance matching film 10 has a sheet resistance of, for example, 200 to 800$\Omega/\square$. This makes it likely that the impedance matching film 10 has the characteristic desirable in terms of impedance matching. The sheet resistance of the impedance matching film 10 may be 220$\Omega/\square$ or more, 250$\Omega/\square$ or more, 275$\Omega/\square$ or more, or 300 $\Omega/\square$ or more. The sheet resistance of the impedance matching film 10 may be 800$\Omega/\square$ or less, 700$\Omega/\square$ or less, 600$\Omega/\square$ or less, 500$\Omega/\square$ or less, or 450 $\Omega/\square$ or less.

The content of the tin oxide in the impedance matching film 10 is not limited to a particular value as long as the above main component has an amorphous structure. The content of the tin oxide in the impedance matching film 10 is desirably determined so that the impedance matching film 10 will be likely to maintain its amorphous state. The content of the tin oxide in the impedance matching film 10 is, for example, 20 mass % or more. In this case, the impedance matching film 10 is likely to maintain its amorphous state. The content of the tin oxide in the impedance matching film 10 may be 25 mass % or more.

The content of the tin oxide in the impedance matching film 10 may be more than 40 mass %. In this case, the impedance matching film 10 is likely to show good acid resistance.

The content of the tin oxide in the impedance matching film 10 is, for example, 90 mass % or less and may be 80 mass % or less or 70 mass % or less. The content of the tin oxide in the impedance matching film 10 may be 60 mass % or less. The content of the tin oxide in the impedance matching film 10 is desirably less than 90 mass % and more desirably 80 mass % or less. In such cases, the specific resistance of the impedance matching film 10 is likely to be adjusted to the desired range. As a result, the impedance matching film 10 formed to a thickness of 16 nm or more and less than 100 nm is likely to have the desired sheet resistance.

The impedance matching film 10 may further include, for example, an additive. The additive has, for example, at least an atom different from an indium atom, a tin atom, and an oxygen atom. Inclusion of the additive in the impedance matching film 10 makes it easy to adjust the properties, such as the specific resistance, of the impedance matching film 10. Inclusion of the additive also makes it possible, in some cases, to obtain an amorphous material using the main component having composition that makes it difficult for the main component to turn into an amorphous state by itself.

The additive has, for example, at least one atom selected from the group consisting of a silicon atom, a titanium atom, a magnesium atom, a nitrogen atom, and a hydrogen atom.

A reliability test is performed in which the impedance matching film 10 is exposed to an environment at a temperature of 125° C. for 1000 hours. The initial sheet resistance of the impedance matching film 10 before the reliability test is represented by Shb [Ω/□], and the sheet resistance of the impedance matching film 10 after the reliability test is represented by Sha [Ω/□]. A sheet resistance change rate ΔSh determined for the impedance matching film 10 by the following equation (1) is, for example, 25% or less, desirably 20% or less, more desirably 15% or less, and even more desirably 10% or less. In these cases, the sheet resistance of the impedance matching film 10 is unlikely to vary even when the impedance matching film 10 is exposed to a high-temperature environment for a long period of time. This is advantageous in terms of long-term impedance matching in a high-temperature environment.

$$\Delta Sh[\%]=100\times|Sha-Shb|/Shb \quad \text{Equation (1)}$$

The impedance matching film 10 may have good properties in terms of acid resistance. For example, an acid resistance test is performed in which the impedance matching film 10 is immersed in 0.5 mol/L or 1.0 mol/L hydrochloric acid for 2 minutes at ordinary temperature (20° C.±15° C. according to Japanese Industrial Standards (JIS) Z 8703). The initial sheet resistance of the impedance matching film 10 before the acid resistance test is represented by Scb [Ω/□], and the sheet resistance of the impedance matching film 10 after the acid resistance test is represented by Sca [Ω/□]. A sheet resistance change rate ΔSc determined for the impedance matching film 10 by the following (2) is, for example, 10% or less, desirably 5% or less, and more desirably 3% or less. In these cases, the sheet resistance of the impedance matching film 10 is unlikely to vary even when the impedance matching film 10 has contact with an acid. This is advantageous in terms of impedance matching in an environment where an acid is present. The sheet resistance of the impedance matching film 10 refers to the initial sheet resistance before the reliability test and acid resistance test, unless otherwise specified.

$$\Delta Sc[\%]=100\times|Sca-Scb|/Scb \quad \text{Equation (2)}$$

The substrate 22 plays a role, for example, as a support that supports the impedance matching film 10. The impedance matching film 10 is formed, for example, on one principal surface of the substrate 22 by sputtering using a given target material. In this case, for example, a target material including the mixture containing indium oxide and tin oxide and being the main component of the target material is used. The Hall mobility of the impedance matching film 10 can be adjusted to the above range by adjusting given conditions, such as the ratio of the volumetric flow rate of oxygen gas to the volumetric flow rate of a mixed gas supplied in sputtering, as well as the composition of the target material. Typically, the higher the ratio of the volumetric flow rate of the oxygen gas to the volumetric flow rate of the mixed gas is, the more likely the Hall mobility of the resistive film is to be high. The mixed gas can include, for example, argon gas in addition to the oxygen gas. For example, target materials having the same composition are used in sputtering performed at different ratios of the volumetric flow rate of the oxygen gas to the volumetric flow rate of the mixed gas to produce samples of a plurality of resistive films, and the Hall mobilities of the samples are measured. The sputtering conditions for formation of the impedance matching film 10 can be determined from the measurement results. The impedance matching film 10 may be formed by a method such as ion plating or coating (for example, bar coating) in some cases.

Figure 2A:
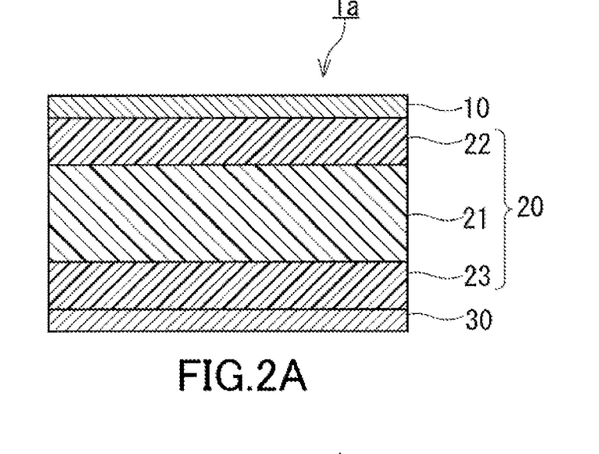
FIG. 2A is a cross-sectional view showing an example of a radio wave absorber according to the present invention.

As shown in FIG. 2A, a radio wave absorber 1a can be provided using the impedance matching film 10. The radio wave absorber 1a includes the impedance matching film 10, an electrical conductor 30, and a dielectric layer 20. The electrical conductor 30 reflects a radio wave. The dielectric layer 20 is disposed, for example, between the impedance matching film 10 and the electrical conductor 30 in a thickness direction of the impedance matching film 10.

The radio wave absorber 1a is a λ/4 radio wave absorber. The radio wave absorber 1a is designed to cause interference between a radio wave reflected by the surface of the impedance matching film 10 (front surface reflection) and a radio wave reflected by the electrical conductor 30 (back surface reflection) upon incidence of a radio wave having a wavelength ($\lambda_0$) to be absorbed on the radio wave absorber 1a. In the λ/4 radio wave absorber, the wavelength $\lambda_0$ of a radio wave to be absorbed is determined according to the thickness t of the dielectric layer and the relative permittivity $\varepsilon_r$ of the dielectric layer, as shown in the following equation (3). That is, a radio wave having a wavelength to be absorbed can be set by appropriately adjusting the relative permittivity and thickness of the dielectric layer. In the equation (3), sqrt($\varepsilon_r$) means a square root of the relative permittivity $\varepsilon_r$.

$$\lambda_0=4t\times\text{sqrt}(\varepsilon_r) \quad \text{Equation (3)}$$

By virtue of the inclusion of the above impedance matching film 10, the radio wave absorber 1a is likely to maintain desired radio wave absorption performance when exposed to a high-temperature environment for a long period of time. A reliability test is performed in which the radio wave absorber 1a is exposed to an environment at a temperature of 125° C. for 1000 hours. The radio wave absorber 1a can exhibit, for example, a return loss of 10 dB or more for a vertically incident radio wave having a wavelength to be absorbed before and after the reliability test. The return loss can be measured, for example, according to JIS R 1679: 2007.

In designing the λ/4 radio wave absorber, the sheet resistance of the impedance matching film 10 is determined so that an impedance expected on a front surface of the impedance matching film 10 based on the transmission-line theory will be equal to a characteristic impedance. In the λ/4 radio wave absorber, the sheet resistance required of the impedance matching film 10 can change according to a possible incident angle at which a radio wave is incident on the λ/4 radio wave absorber. The term "sheet resistance of the impedance matching film 10" refers to the value of the initial sheet resistance before the above-described reliability test, unless otherwise described.

The electrical conductor 30 is not particularly limited as long as the electrical conductor 30 can reflect a radio wave to be absorbed. The electrical conductor 30 has a given electrical conductivity. As shown in FIG. 2A, the electrical conductor 30 is formed, for example, in the form of a layer. In this case, the electrical conductor 30 has a lower sheet resistance than that of the impedance matching film 10. The electrical conductor 30 may be in a form other than a layer.

The electrical conductor 30 includes, for example, indium tin oxide. In this case, the electrical conductor 30 is likely to have high transparency.

The content of tin oxide in the indium tin oxide in the electrical conductor 30 is, for example, 5 to 15 mass %. In this case, the electrical conductor 30 can be formed of indium tin oxide in a stable polycrystalline state by annealing treatment. This makes it likely for the radio wave absorber 1a to more reliably exhibit desired radio wave absorption performance when the radio wave absorber 1a is exposed to a high-temperature environment for a long period of time.

The electrical conductor 30 may include at least one selected from the group consisting of aluminum, copper, iron, an aluminum alloy, a copper alloy, and an iron alloy. In this case, a desired electrical conductivity is likely to be achieved while the thickness of the electrical conductor 30 is reduced.

The thickness of the electrical conductor 30 is not limited to a particular thickness. For example, when the electrical conductor 30 is formed of the indium tin oxide, the electrical conductor 30 has a thickness of, for example, 20 to 200 nm and desirably 50 to 150 nm. In this case, the radio wave absorber 1a can exhibit desired radio wave absorption performance, and cracking of the electrical conductor 30 is less likely to occur.

When the electrical conductor 30 is at least one selected from the group consisting of aluminum, copper, iron, an aluminum alloy, a copper alloy, and an iron alloy, the electrical conductor 30 has a thickness of, for example, 30 nm to 100 μm and desirably has a thickness of 50 nm to 50 μm.

The relative permittivity of the dielectric layer 20 is, for example, 2.0 to 20.0. In this case, the thickness of the dielectric layer 20 is easily adjusted and the radio wave absorption performance of the radio wave absorber 1a is easily adjusted. The relative permittivity of the dielectric layer 20 is, for example, a relative permittivity measured at 10 GHz by a cavity resonance method.

The dielectric layer 20 is formed of, for example, a given polymer. The dielectric layer 20 includes, for example, at least one polymer selected from the group consisting of ethylene-vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer. In this case, the thickness of the dielectric layer 20 is easily adjusted and the manufacturing cost of the radio wave absorber 1a can be maintained at a low level. The dielectric layer 20 can be produced, for example, by hot-pressing a given resin composition.

The dielectric layer 20 may be formed as a single layer or as a plurality of layers made of the same material or different materials. When the dielectric layer 20 includes n layers (n is an integer of 2 or greater), the relative permittivity of the dielectric layer 20 is determined, for example, as follows. The relative permittivity $\varepsilon_i$ of each layer is measured (i is an integer of 1 to n). Next, the relative permittivity $\varepsilon_i$ of each layer is multiplied by the proportion of the thickness $t_i$ of the layer in the total thickness T of the dielectric layer 20 to determine $\varepsilon_i \times (t_i/T)$. The relative permittivity of the dielectric layer 20 can be determined by adding the $\varepsilon_i \times (t_i/T)$ values of all layers.

As shown in FIG. 2A, the dielectric layer 20 includes, for example, a first layer 21, a second layer 22, and a third layer 23. The first layer 21 is disposed between the second layer 22 and the third layer 23. The first layer 21 includes, for example, at least one polymer selected from the group consisting of ethylene-vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer.

Figure 2B:
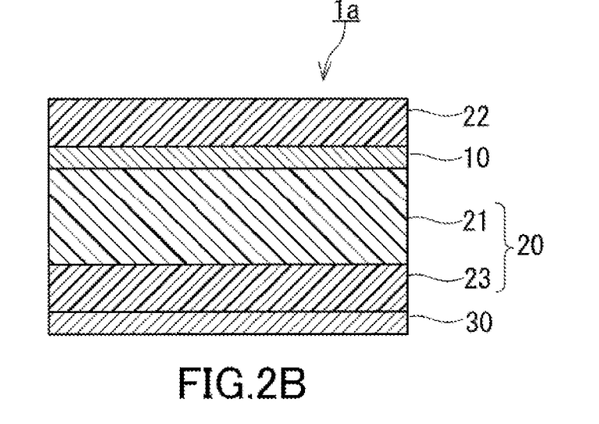
FIG. 2B is a cross-sectional view showing a variation of the radio wave absorber shown in FIG. 2A.

In the radio wave absorber 1a, the second layer 22 doubles as a substrate for the impedance matching film 10. The second layer 22 is, for example, disposed closer to the electrical conductor 30 than the impedance matching film 10 is. As shown in FIG. 2B, the second layer 22 may be disposed farther from the electrical conductor 30 than the impedance matching film 10 is. In this case, the dielectric layer 20 is composed of the first layer 21 and the third layer 23. In this case, the second layer 22 protects the impedance matching film 10 and the dielectric layer 20, and the radio wave absorber 1a has high durability. In this case, for example, the impedance matching film 10 may be in contact with the first layer 21. The second layer 22, for example, also plays a role as an auxiliary member for adjusting the thickness of the impedance matching film 10 with high accuracy. The material of the second layer 22 is, for example, polyethylene terephthalate (PET), polyethylene naphthalate (PEN), acrylic resin (PMMA), polycarbonate (PC), polyimide (PI), or cycloolefin polymer (COP). Among these, the material of the second layer 22 is desirably PET in terms of the balance among good heat-resistance, dimensional stability, and manufacturing cost.

The substrate 22 has a thickness of, for example, 10 to 150 μm and desirably 15 to 100 μm. In this case, the substrate 22 has low flexural rigidity, and occurrence of a wrinkle in the substrate 22 or deformation of the substrate 22 can be reduced at the time of formation of the impedance matching film 10.

Figure 2C:
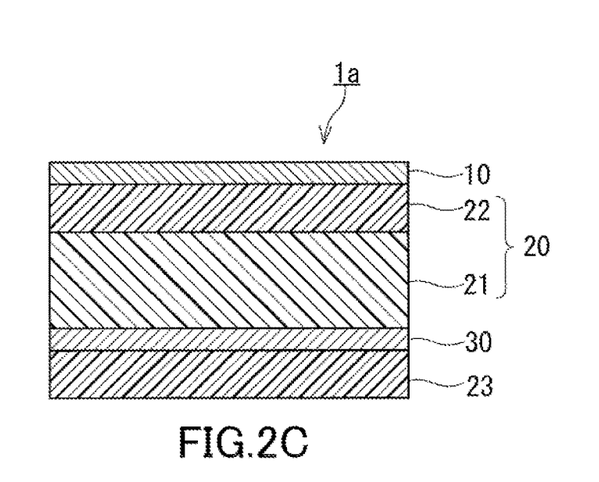
FIG. 2C is a cross-sectional view showing another variation of the radio wave absorber shown in FIG. 2A.

In the radio wave absorber 1a, the third layer 23 supports, for example, the electrical conductor 30 in the form of a layer. In this case, the electrical conductor 30 in the form of a layer is, for example, a metallic foil or an alloy foil. The electrical conductor 30 in the form of a layer may be produced, for example, by forming a film on the third layer 23 by a method such as sputtering, ion plating, or coating (for example, bar coating). In the radio wave absorber 1a, for example, the third layer 23 is disposed closer to the impedance matching film 10 than the electrical conductor 30 in the form of a layer is and constitutes a portion of the dielectric layer 20. As shown in FIG. 2C, the third layer 23 may be disposed farther from the impedance matching film 10 than the electrical conductor 30 in the form of a layer is. In this case, for example, the electrical conductor 30 in the form of a layer is in contact with the first layer 21.

The examples of the material of the second layer 22, for example, can be used as the material of the third layer 23. The material of the third layer 23 may be the same as or different from the material of the second layer 22. The material of the third layer 23 is desirably PET in terms of the balance among good heat-resistance, dimensional stability, and manufacturing cost.

The third layer 13 has a thickness of, for example, 10 to 150 μm and desirably 15 to 100 μm. In this case, the third layer 23 has low flexural rigidity, and occurrence of a wrinkle in the third layer 23 or deformation of the third layer 23 can be reduced at the time of formation of the electrical conductor 30 in the form of a layer. The third layer 23 can be omitted in some cases.

The first layer 21 may be composed of a plurality of layers. The first layer 21 can be composed of a plurality of layers particularly when the first layer 21 is in contact with at least one of the impedance matching film 10 and the electrical conductor 30 in the form of a layer, as shown in FIG. 2B and FIG. 2C.

The first layer 21 may or may not have adhesiveness. When the first layer 21 has adhesiveness, an adhesive layer may be disposed in contact with at least one of the principal surfaces of the first layer 21 or may not be disposed in contact with either of the principal surfaces of the first layer 21. The first layer 21 having adhesiveness eliminates the need for an adhesive layer that is not the first layer 21. Consequently, in the radio wave absorber 1a, thickness non-uniformity of an adhesive layer that is not the first layer 21 does not occur and thickness non-uniformity of the radio wave absorber 1a as a whole can be reduced. As a result, the radio wave absorber 1a is likely to stably exhibit the radio wave absorption performance. When the first layer 21 does not have adhesiveness, an adhesive layer is desirably disposed in contact with each of the principal surfaces of the first layer 21. When the dielectric layer 20 includes the second layer 22 which may not have adhesiveness, an adhesive layer may not be disposed in contact with both of the principal surfaces of the second layer 22. When the dielectric layer 20 includes the second layer 22, an adhesive layer can be disposed in contact with one principal surface of the second layer 22. When the dielectric layer 20 includes the third layer 23 which may not have adhesiveness, an adhesive layer may not be disposed in contact with both of the principal surfaces of the third layer 23. An adhesive layer can be disposed in contact with at least one principal surface of the third layer 23.

In the radio wave absorber 1a, the layer(s) adjacent to the impedance matching film 10 includes a given acid component in some cases. The layer(s) adjacent to the impedance matching film 10 includes the acid component so that, for example, an acid value determined for a specimen including a portion of the layer(s) according to "3.1 Neutralization titration method" in JIS K 0070: 1992 will be 5 or greater. In this case, for example, when the sheet resistance change rate ΔSc of the impedance matching film 10 is in the above range, the acid component included in the layer(s) adjacent to the impedance matching film 10 is unlikely to vary the sheet resistance of the impedance matching film 10.

The radio wave absorber 1a is designed to absorb a radio wave having a desired wavelength. The type of a radio wave the radio wave absorber 1a can absorb is not particularly limited. A radio wave the radio wave absorber 1a can absorb can be, for example, a millimeter or submillimeter wave in a particular frequency range.

The radio wave absorber 1a can be modified in various respects. For example, the radio wave absorber 1a may be modified to a radio wave absorber 1b shown in FIG. 3A, a radio wave absorber 1c shown in FIG. 3B, a radio wave absorber 1d shown in FIG. 4A, or a radio wave absorber 1e shown in FIG. 5A. The radio wave absorbers 1b, 1c, 1d, and 1e are configured in the same manner as the radio wave absorber 1a unless otherwise described. The components of the radio wave absorbers 1b, 1c, 1d, and 1e that are the same as or correspond to the components of the radio wave absorber 1a are denoted by the same reference characters, and detailed descriptions of such components are omitted. The description given for the radio wave absorber 1a is applicable to the radio wave absorbers 1b, 1c, 1d, and 1e unless there is a technical inconsistency.

Figure 3A:
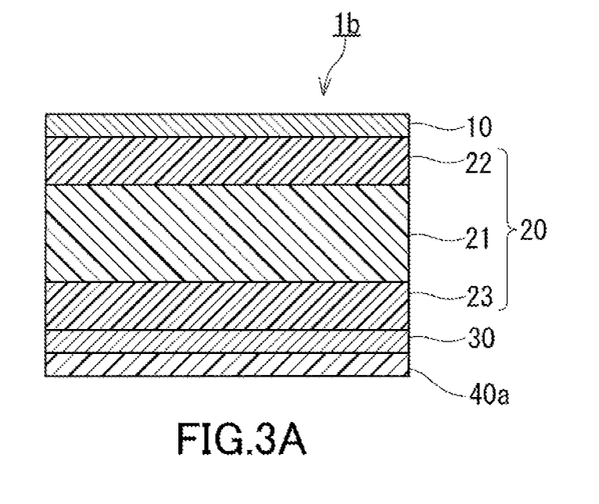
FIG. 3A is a cross-sectional view showing another example of the radio wave absorber according to the present invention.
Figure 3B:
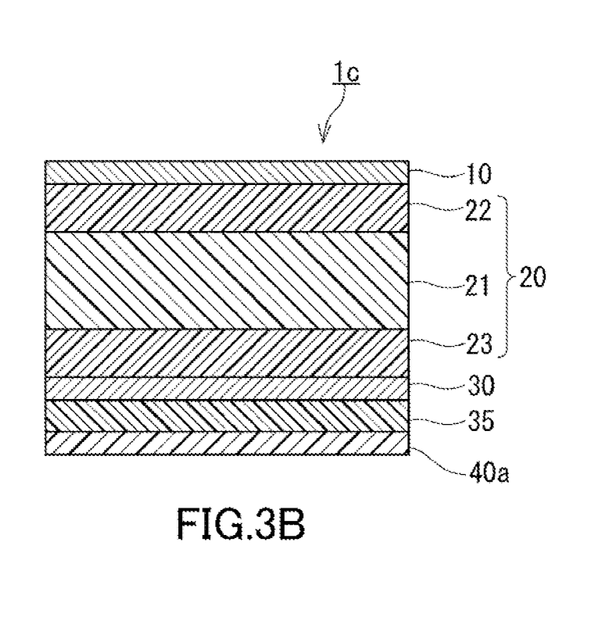
FIG. 3B is a cross-sectional view showing yet another example of the radio wave absorber according to the present invention.

As shown in FIG. 3A, the radio wave absorber 1b further includes an adhesive layer 40a. In the radio wave absorber 1b, the electrical conductor 30 is disposed between the dielectric layer 20 and the adhesive layer 40a. On the other hand, as shown in FIG. 3B, the radio wave absorber 1c further includes the adhesive layer 40a and an electrical conductor protecting layer 35. The electrical conductor 30 is disposed between the dielectric layer 20 and the adhesive layer 40a. Additionally, the electrical conductor protecting layer 35 is disposed between the electrical conductor 30 and the adhesive layer 40a.

For example, the radio wave absorber 1b or 1c can be attached to a given article by bringing the adhesive layer 40a into contact with the article and pressing the radio wave absorber 1b or 1c to the article. A radio wave absorber-attached article can be obtained in this manner.

The adhesive layer 40a includes, for example, a rubber pressure-sensitive adhesive, an acrylic pressure-sensitive adhesive, a silicone pressure-sensitive adhesive, or a urethane pressure-sensitive adhesive. The radio wave absorber 1b may further include a separator (not illustrated). In this case, the separator covers the adhesive layer 40a. The separator is typically a film capable of maintaining the adhesiveness of the adhesive layer 40a while covering the adhesive layer 40a, the film being easily removable from the adhesive layer 40a. The separator is, for example, a film made of a polyester resin such as PET. Removal of the separator exposes the adhesive layer 40a and makes it possible to attach the radio wave absorber 1b or 1c to an article.

In the radio wave absorber 1c, for example, those mentioned as examples of the material of the second layer 22 can be used as the material of the electrical conductor protecting layer 35. The electrical conductor protecting layer 35 can prevent the component included in the adhesive layer 40a from having contact with the electrical conductor 30. As a result, the durability of the electrical conductor 30 is likely to be increased.

Figure 4A:
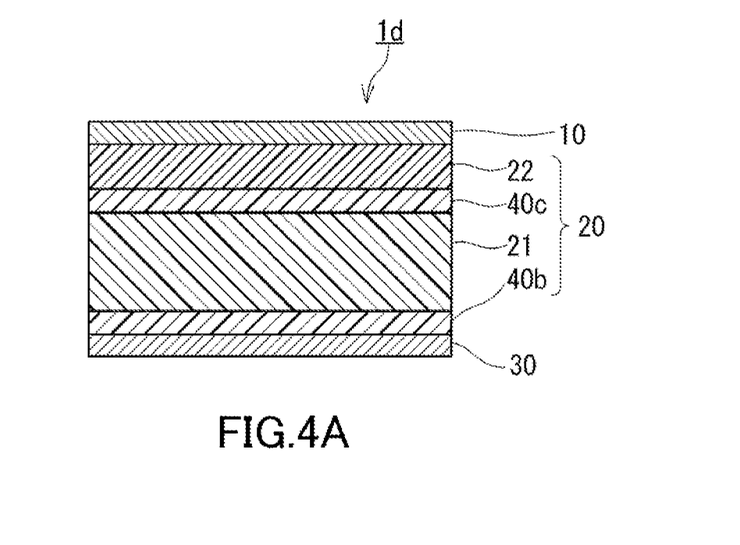
FIG. 4A is a cross-sectional view showing yet another example of the radio wave absorber according to the present invention.

In the radio wave absorber, the dielectric layer 20 may have adhesiveness to the electrical conductor 30. For example, as shown in FIG. 4A, the dielectric layer 20 of the radio wave absorber 1d has a plurality of layers including an adhesive layer 40b. The adhesive layer 40b is in contact with the electrical conductor 30. The adhesive layer 40b includes, for example, a rubber pressure-sensitive adhesive, an acrylic pressure-sensitive adhesive, a silicone pressure-sensitive adhesive, or a urethane pressure-sensitive adhesive. The adhesive layer 40b is disposed, for example, between the first layer 21 and the electrical conductor 30.

As shown in FIG. 4A, the dielectric layer 20 further includes an adhesive layer 40c. The adhesive layer 40c is, for example, in contact with the second layer 22. The radio wave absorber 1d may be modified in such a manner that the adhesive layer 40c is in contact with the impedance matching film 10. The adhesive layer 40c includes, for example, a rubber pressure-sensitive adhesive, an acrylic pressure-sensitive adhesive, a silicone pressure-sensitive adhesive, or a urethane pressure-sensitive adhesive. The adhesive layer 40c is disposed, for example, between the first layer 21 and the second layer 22.

Figure 4B:
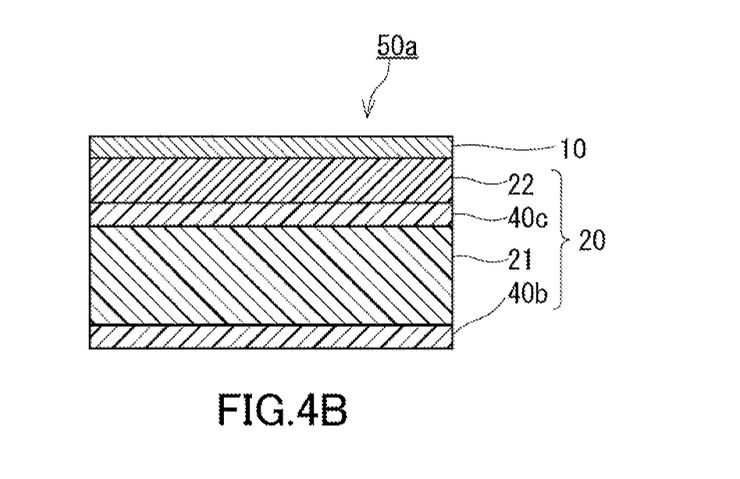
FIG. 4B is a cross-sectional view showing an example of a laminate for a radio wave absorber according to the present invention.
Figure 5A:
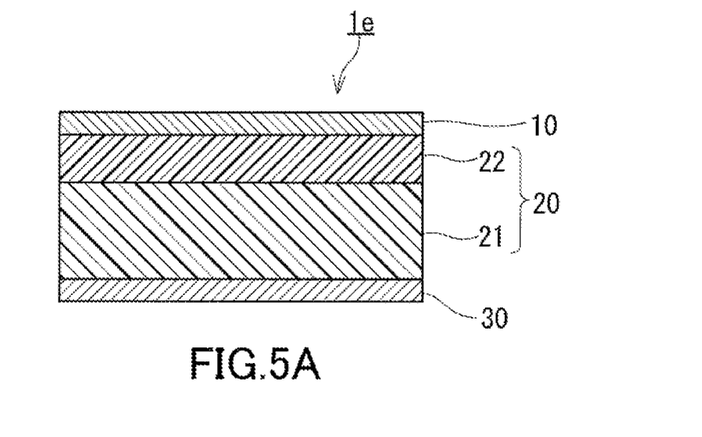
FIG. 5A is a cross-sectional view showing yet another example of the radio wave absorber according to the present invention.

The radio wave absorber 1e can be produced, for example, using a laminate 50a for a radio wave absorber shown in FIG. 4B. The laminate 50a for a radio wave absorber includes the impedance matching film 10 and the dielectric layer 20. The dielectric layer 20 is disposed in contact with the impedance matching film 10 in the thickness direction of the impedance matching film 10.

In the laminate 50a for a radio wave absorber, for example, a principal surface of the dielectric layer 20 has adhesiveness, the principal surface being farther from the impedance matching film 10.

In this case, for example, the radio wave absorber 1e can be produced by bringing the dielectric layer 20 into contact with the electrical conductor 30 and pressing the laminate 50a for a radio wave absorber to the electrical conductor 30 to attach the laminate 50a for a radio wave absorber to the electrical conductor 30.

As shown in FIG. 4B, the dielectric layer 20 of the laminate 50a for a radio wave absorber has, for example, a plurality of layers including the adhesive layer 40b. The adhesive layer 40b is disposed farthest from the impedance matching film 10 in the plurality of layers composing the dielectric layer 20.

The laminate 50a for a radio wave absorber may further include a separator (not illustrated). In this case, the separator covers the adhesive layer 40b. The separator is typically a film capable of maintaining the adhesiveness of the adhesive layer 40b while covering the adhesive layer 40b, the film being easily removable from the adhesive layer 40b. The separator is, for example, a film made of a polyester resin such as PET. Removal of the separator exposes the adhesive layer 40b and makes it possible to attach the laminate 50a for a radio wave absorber to the electrical conductor 30.

As shown in FIG. 5A, in the radio wave absorber 1e, the first layer 21 is in contact with the electrical conductor 30. The first layer 21 has adhesiveness, for example, to the electrical conductor 30. The first layer 21 is, for example, in contact with the second layer 22. The first layer 21 has adhesiveness, for example, to the second layer 22. The radio wave absorber 1e may be modified in such a manner that the first layer 21 is in contact with the impedance matching film 10. In this case, the first layer 21 has adhesiveness, for example, to the impedance matching film 10.

Figure 5B:
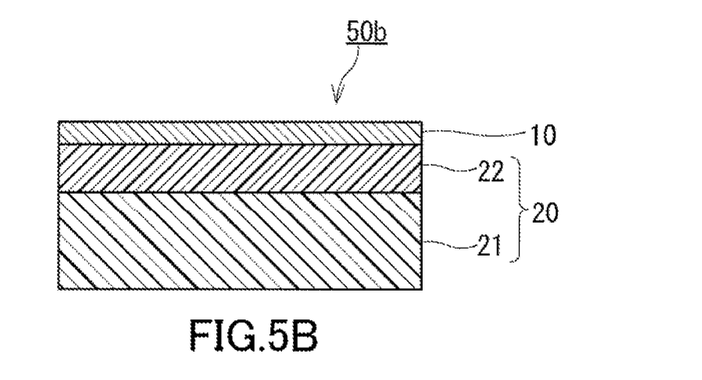
FIG. 5B is a cross-sectional view showing another example of the laminate for a radio wave absorber according to the present invention.

The radio wave absorber 1e can be produced, for example, using a laminate 50b for a radio wave absorber shown in FIG. 5B. The laminate 50b for a radio wave absorber includes the impedance matching film 10 and the dielectric layer 20. The dielectric layer 20 is disposed in contact with the impedance matching film 10 in the thickness direction of the impedance matching film 10.

In the laminate 50b for a radio wave absorber, a principal surface of the dielectric layer 20 has adhesiveness, the principal surface being farther from the impedance matching film 10. For example, the first layer 21 has adhesiveness. For example, the radio wave absorber 1e can be produced by bringing the first layer 21 into contact with the electrical conductor 30 and pressing the laminate 50b for a radio wave absorber to the electrical conductor 30 to attach the laminate 50b for a radio wave absorber to the electrical conductor 30.

The laminate 50b for a radio wave absorber may further include a separator (not illustrated). In this case, the separator covers the surface of the dielectric layer 20 to be in contact with the electrical conductor 30. The separator is typically a film capable of maintaining the adhesiveness of the surface of the dielectric layer 20 to be in contact with the electrical conductor 30 while covering the surface of the dielectric layer 20 to be in contact with the electrical conductor 30, the film being easily removable from the dielectric layer 20. The separator is, for example, a film made of a polyester resin such as PET. Removal of the separator exposes the surface of the dielectric layer 20 to be in contact with the electrical conductor 30 and makes it possible to attach the laminate 50b for a radio wave absorber to the electrical conductor 30.

The configuration of the laminate for a radio wave absorber is not limited to a particular configuration as long as the laminate for a radio wave absorber includes the impedance matching film 10 and the dielectric layer 20 and the dielectric layer 20 is disposed in contact with the impedance matching film 10 in the thickness direction of the impedance matching film 10.

EXAMPLES

The present invention will be described in more detail by examples. The present invention is not limited to the examples given below. First, methods for evaluation of Examples and Comparative Examples will be described.

[X-Ray Diffraction]

The thickness was measured for resistive films of resistive film-attached films according to Examples and Comparative Examples by X-ray reflectivity using an X-ray diffractometer (manufactured by Rigaku Corporation, product name: RINT2200). The results are shown in Table 1. Additionally, X-ray diffraction patterns of the resistive films were obtained using an X-ray diffractometer. A Cu-Kα radiation was used as the X-ray. It was confirmed from the obtained X-ray diffraction patterns that in Examples and Comparative Examples, the resistive films had amorphous structures.

[Hall Mobility]

Hall effect measurement was performed for the resistive films according to Examples and Comparative Examples according to the van der Pauw method using a Hall effect measurement system (manufactured by Nanometrics Incorporated, product name: HL5500PC). From the results of the Hall effect measurement, Hall mobilities of the resistive films according to Examples and Comparative Examples were determined. The results are shown in Table 1. The Hall effect measurement was performed for samples yet to undergo the following reliability test and acid resistance test.

[Specific Resistance]

Initial sheet resistances of the resistive films according to Examples and Comparative Examples were measured by an eddy current method according to JIS Z 2316 using a non-contact resistance measurement apparatus (manufactured by NAPSON CORPORATION, product name: NC-80MAP). In each of Examples and Comparative Examples, a product of the thickness of the resistive film measured as described above and the initial sheet resistance of the resistive film measured as described above was calculated to determine the specific resistance of the resistive film. The results are shown in Table 1. The initial sheet resistances of the resistive films according to Examples and Comparative Examples were each measured using a laminate which includes the resistive film-attached film and an acrylic resin layer and on which an undermentioned electrical conductor attached film was not placed.

[Reliability Test]

A reliability test was performed in which a radio wave absorber according to each Example was exposed to an environment at 125° C. for 1000 hours. Before and after the reliability test, the radio wave absorber according to each Example was measured for a return loss (the absolute value of the ratio, expressed in dB, of the electric power of a reflected wave to the electric power of an incident wave) according to JIS R 1679: 2007 using a 76-GHz millimeter wave perpendicularly incident on the radio wave absorber. The term "return loss" herein corresponds to the term "reflection amount" in JIS R 1679: 2007. A radio wave absorber according to each Comparative Example, which was not subjected to the reliability test, was measured for a return loss according to JIS R 1679: 2007 using a 76-GHz millimeter wave perpendicularly incident on the radio wave absorber. For each of Examples and Comparative Examples, five samples were measured for return losses. The average of the measured return losses was used to evaluate a return loss of the radio wave absorber according to each of Examples and Comparative Examples according to the following criteria. The results are shown in Table 1. As to the radio wave absorbers according to Comparative Examples not having been subjected to the reliability test, the cells for results of evaluation of return losses after the reliability test show "-".

AA: The average return loss is 20 dB or more.
A: The average return loss is 10 dB or more and less than 20 dB.
X: The average return loss is less than 10 dB.

After the above reliability test, electrical conductor-attached films were separated from the samples of the radio wave absorbers according to Examples to produce specimens. Then, sheet resistances of the resistive films of the specimens were measured by an eddy current method according to JIS Z 2316 using a non-contact resistance measurement apparatus (manufactured by NAPSON CORPORATION; product name: NC-80MAP). From the results of this measurement and the results of measurement of the initial sheet resistances, sheet resistance change rates ΔSh of the resistive films according to Examples were calculated by the above equation (1). The results are shown in Table 1. As to the radio wave absorbers according to Comparative Examples not having been subjected to the reliability test, the cells for their sheet resistance change rates ΔSh show "-".

[Acid Resistance Test]

A 30-nm-square piece cut out of each of the resistive film-attached films according to Examples was adhered to a glass slide using an adhesive tape to prepare a sample for an acid resistance test. The samples according to Examples were immersed in hydrochloric acid having a concentration of 0.5 mol/L or 1.0 mol/L for 2 minutes. The immersed pieces of the samples according to Examples were separated from the glass slides. After that, sheet resistances of the resistive films of the samples according to Examples were measured by an eddy current method according to JIS Z 2316 using a non-contact resistance measurement apparatus (manufactured by NAPSON CORPORATION; product name: NC-80MAP). From the results of this measurement and the results of measurement of the initial sheet resistances, sheet resistance change rates ΔSc of the resistive films according to Examples were calculated by the above equation (2). The results are shown in Table 1. As to the resistive films according to Comparative Examples not having been subjected to the acid resistance test, the cells for their sheet resistance change rates ΔSc show "-".

Example 1

A resistive film according to Example 1 was formed on a PET film (manufactured by Mitsubishi Chemical Corporation; product name: DIAFOIL; thickness: 23 μm) by sputtering using an ITO including 30 weight % of $SnO_2$ as a target material while a mixed gas including argon gas and oxygen gas was being supplied. A resistive film-attached film according to Example 1 was obtained in this manner. In the sputtering, the ratio of the volumetric flow rate of the oxygen gas to the volumetric flow rate of the mixed gas was adjusted so that the resistive film would have a thickness of 44 nm, an initial sheet resistance of 386Ω/□, and a Hall mobility of 15 $cm^2/(V \cdot s)$. The ratio of the volumetric flow rate of the oxygen gas to the volumetric flow rate of the argon gas was 0.7%. An electrical conductor-attached film was prepared in which a 25-μm-thick PET film and a 7-μm-thick aluminum foil were laminated. An acrylic resin having a relative permittivity of 2.6 was shaped to a thickness of 560 μm to obtain an acrylic resin layer. The resistive film-attached film according to Example 1 was placed on the acrylic resin layer in such a manner that the resistive film of the resistive film-attached film according to Example 1 was in contact with the acrylic resin layer. Then, the electrical conductor-attached film was also placed on the acrylic resin layer in such a manner that the PET film of the electrical conductor-attached film was in contact with the acrylic resin layer. A radio wave absorber according to Example 1 was obtained in this manner. The radio wave absorber according to Example 1 had a configuration corresponding to the radio wave absorber 1a shown in FIG. 2B. The acrylic resin layer had adhesiveness to the resistive film of the resistive film-attached film and the PET film of the electrical conductor-attached film, and the resistive film-attached film and the electrical conductor-attached film were adhered to the acrylic resin layer without using an adhesive.

Example 2

A resistive film-attached film according to Example 2 was produced in the same manner as in Example 1, except for the following. In the sputtering, the ratio of the volumetric flow rate of the oxygen gas to the volumetric flow rate of the mixed gas was adjusted so that the resistive film would have a thickness of 19 nm, an initial sheet resistance of 416Ω/□, and a Hall mobility of 31 $cm^2/(V \cdot s)$. The ratio of the volumetric flow rate of the oxygen gas to the volumetric flow rate of the argon gas was 2.0%. A radio wave absorber according to Example 2 was obtained in the same manner as in Example 1, except that a resistive film-attached film according to Example 2 was used instead of the resistive film-attached film according to Example 1.

Example 3

A resistive film-attached film according to Example 3 was produced in the same manner as in Example 1, except for the following. In the sputtering, the ratio of the volumetric flow rate of the oxygen gas to the volumetric flow rate of the mixed gas was adjusted so that the resistive film would have a thickness of 22 nm, an initial sheet resistance of 318Ω/□, and a Hall mobility of 46 $cm^2/(V \cdot s)$. The ratio of the volumetric flow rate of the oxygen gas to the volumetric flow rate of the argon gas was 3.3%. A radio wave absorber according to Example 3 was obtained in the same manner as in Example 1, except that a resistive film-attached film according to Example 3 was used instead of the resistive film-attached film according to Example 1.

Example 4

A resistive film-attached film according to Example 4 was produced in the same manner as in Example 1, except for the following. An ITO including 50 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 90 nm, an initial sheet resistance of 456Ω/□, and a Hall mobility of 8 cm²/(V·s). The ratio of the volumetric flow rate of the oxygen gas to the volumetric flow rate of the argon gas was 2.0%. A radio wave absorber according to Example 4 was obtained in the same manner as in Example 1, except that a resistive film-attached film according to Example 4 was used instead of the resistive film-attached film according to Example 1.

Example 5

A resistive film-attached film according to Example 5 was produced in the same manner as in Example 1, except for the following. An ITO including 50 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 36 nm, an initial sheet resistance of 361Ω/□, and a Hall mobility of 23 cm²/(V·s). The ratio of the volumetric flow rate of the oxygen gas to the volumetric flow rate of the argon gas was 3.3%. A radio wave absorber according to Example 5 was obtained in the same manner as in Example 1, except that a resistive film-attached film according to Example 5 was used instead of the resistive film-attached film according to Example 1.

Example 6

A resistive film-attached film according to Example 6 was produced in the same manner as in Example 1, except for the following. An ITO including 50 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 26 nm, an initial sheet resistance of 385Ω/□, and a Hall mobility of 41 cm²/(V·s). The ratio of the volumetric flow rate of the oxygen gas to the volumetric flow rate of the argon gas was 4.7%. A radio wave absorber according to Example 6 was obtained in the same manner as in Example 1, except that a resistive film-attached film according to Example 6 was used instead of the resistive film-attached film according to Example 1.

Example 7

A resistive film-attached film according to Example 7 was produced in the same manner as in Example 1, except for the following. An ITO including 20 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 50 nm, an initial sheet resistance of 396Ω/□, and a Hall mobility of 10 cm²/(V·s). The ratio of the volumetric flow rate of the oxygen gas to the volumetric flow rate of the argon gas was 0.7%. A radio wave absorber according to Example 7 was obtained in the same manner as in Example 1, except that a resistive film-attached film according to Example 7 was used instead of the resistive film-attached film according to Example 1.

Example 8

A resistive film-attached film according to Example 8 was produced in the same manner as in Example 1, except for the following. An ITO including 20 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 22 nm, an initial sheet resistance of 373Ω/□, and a Hall mobility of 20 cm²/(V·s). The ratio of the volumetric flow rate of the oxygen gas to the volumetric flow rate of the argon gas was 2.0%. A radio wave absorber according to Example 8 was obtained in the same manner as in Example 1, except that a resistive film-attached film according to Example 8 was used instead of the resistive film-attached film according to Example 1.

Example 9

A resistive film-attached film according to Example 9 was produced in the same manner as in Example 1, except for the following. An ITO including 20 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 20 nm, an initial sheet resistance of 360Ω/□, and a Hall mobility of 39 cm²/(V·s). The ratio of the volumetric flow rate of the oxygen gas to the volumetric flow rate of the argon gas was 4.7%. A radio wave absorber according to Example 9 was obtained in the same manner as in Example 1, except that a resistive film-attached film according to Example 9 was used instead of the resistive film-attached film according to Example 1.

Example 10

A resistive film-attached film according to Example 10 was produced in the same manner as in Example 1, except for the following. An ITO including 70 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 52 nm, an initial sheet resistance of 365Ω/□, and a Hall mobility of 20 cm²/(V·s). The ratio of the volumetric flow rate of the oxygen gas to the volumetric flow rate of the argon gas was 3.3%. A radio wave absorber according to Example 10 was obtained in the same manner as in Example 1, except that a resistive film-attached film according to Example 10 was used instead of the resistive film-attached film according to Example 1.

Example 11

A resistive film-attached film according to Example 11 was produced in the same manner as in Example 1, except for the following. An ITO including 70 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 45 nm, an initial sheet resistance of 378Ω/□, and a Hall mobility of 31 $cm^2/(V \cdot s)$. The ratio of the volumetric flow rate of the oxygen gas to the volumetric flow rate of the argon gas was 5.3%. A radio wave absorber according to Example 11 was obtained in the same manner as in Example 1, except that a resistive film-attached film according to Example 11 was used instead of the resistive film-attached film according to Example 1.

Example 12

A resistive film-attached film according to Example 12 was produced in the same manner as in Example 1, except for the following. An $SiO_2$-added ITO including 30 weight % of $SnO_2$ and 2.5 weight % of $SiO_2$ was used as a target material in the sputtering. Additionally, in the sputtering, the ratio of the volumetric flow rate of the oxygen gas to the volumetric flow rate of the mixed gas was adjusted so that the resistive film would have a thickness of 42 nm, an initial sheet resistance of 381Ω/□, and a Hall mobility of 21 $cm^2/(V \cdot s)$. The ratio of the volumetric flow rate of the oxygen gas to the volumetric flow rate of the argon gas was 2.7%. A radio wave absorber according to Example 12 was obtained in the same manner as in Example 1, except that a resistive film-attached film according to Example 12 was used instead of the resistive film-attached film according to Example 1.

Example 13

A resistive film-attached film according to Example 13 was produced in the same manner as in Example 1, except for the following. An $SiO_2$-added ITO including 15 weight % of $SnO_2$ and 5 weight % of $SiO_2$ was used as a target material in the sputtering. Additionally, in the sputtering, the ratio of the volumetric flow rate of the oxygen gas to the volumetric flow rate of the mixed gas was adjusted so that the resistive film would have a thickness of 87 nm, an initial sheet resistance of 402Ω/□, and a Hall mobility of 17 $cm^2/(V \cdot s)$. The ratio of the volumetric flow rate of the oxygen gas to the volumetric flow rate of the argon gas was 2.7%. A radio wave absorber according to Example 13 was obtained in the same manner as in Example 1, except that a resistive film-attached film according to Example 13 was used instead of the resistive film-attached film according to Example 1.

Example 14

A resistive film-attached film according to Example 14 was produced in the same manner as in Example 1, except for the following. A $TiO_2$-added ITO including 15 weight % of $SnO_2$ and 5 weight % of $TiO_2$ was used as a target material in the sputtering. Additionally, in the sputtering, the ratio of the volumetric flow rate of the oxygen gas to the volumetric flow rate of the mixed gas was adjusted so that the resistive film would have a thickness of 98 nm, an initial sheet resistance of 449Ω/□, and a Hall mobility of 15 $cm^2/(V \cdot s)$. The ratio of the volumetric flow rate of the oxygen gas to the volumetric flow rate of the argon gas was 2.0%. A radio wave absorber according to Example 14 was obtained in the same manner as in Example 1, except that a resistive film-attached film according to Example 14 was used instead of the resistive film-attached film according to Example 1.

Comparative Example 1

A resistive film-attached film according to Comparative Example 1 was produced in the same manner as in Example 1, except for the following. An ITO including 50 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 100 nm, an initial sheet resistance of 990Ω/□, and a Hall mobility of 4 $cm^2/(V \cdot s)$. The ratio of the volumetric flow rate of the oxygen gas to the volumetric flow rate of the argon gas was 1.3%. A radio wave absorber according to Comparative Example 1 was obtained in the same manner as in Example 1, except that a resistive film-attached film according to Comparative Example 1 was used instead of the resistive film-attached film according to Example 1.

Comparative Example 2

A resistive film-attached film according to Comparative Example 2 was produced in the same manner as in Example 1, except for the following. An ITO including 15 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 10 nm, an initial sheet resistance of 400Ω/□, and a Hall mobility of 31 $cm^2/(V \cdot s)$. The ratio of the volumetric flow rate of the oxygen gas to the volumetric flow rate of the argon gas was 2.0%. A radio wave absorber according to Comparative Example 2 was obtained in the same manner as in Example 1, except that a resistive film-attached film according to Comparative Example 2 was used instead of the resistive film-attached film according to Example 1.

Comparative Example 3

A resistive film-attached film according to Comparative Example 3 was produced in the same manner as in Example 1, except for the following. An ITO including 50 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 210 nm, an initial sheet resistance of 381Ω/□, and a Hall mobility of 4 $cm^2/(V \cdot s)$. The ratio of the volumetric flow rate of the oxygen gas to the volumetric flow rate of the argon gas was 1.3%. A radio wave absorber according to Comparative Example 3 was obtained in the same manner as in Example 1, except that a resistive film-attached film according to Comparative Example 3 was used instead of the resistive film-attached film according to Example 1.

Comparative Example 4

A resistive film-attached film according to Comparative Example 4 was produced in the same manner as in Example 1, except for the following. An ITO including 90 weight % of $SnO_2$ was used as a target material in the sputtering. Additionally, in the sputtering, the ratio of the volumetric flow rate of the oxygen gas to the volumetric flow rate of the mixed gas was adjusted so that the resistive film would have a thickness of 580 nm and an initial sheet resistance of 397Ω/□. The ratio of the volumetric flow rate of the oxygen gas to the volumetric flow rate of the argon gas was 3.3%. A radio wave absorber according to Comparative Example 4 was obtained in the same manner as in Example 1, except that a resistive film-attached film according to Comparative Example 4 was used instead of the resistive film-attached film according to Example 1.

As shown in Table 1, the radio wave absorbers according to Examples 1 to 14 were able to exhibit good radio wave absorption performance before and after the reliability test. Additionally, ΔSh was 20% or less for the resistive film-attached films according to Examples 1 to 6, 8, and 10 to 14. On the other hand, the radio wave absorbers according to Comparative Examples 1 to 4 were unable to exhibit good radio wave absorption performance. It is suggested that because the resistive film including the mixture containing indium oxide and tin oxide and being the main component of the resistive film, the mixture having an amorphous structure, has a Hall mobility of 5 cm$^2$/(V·s) or more and a thickness of 16 nm or more and less than 100 nm, the resistive film is likely to maintain the characteristic desirable in terms of impedance matching when exposed to a high-temperature environment for a long period of time. ΔSc was 10% or less for the resistive film-attached films according to Examples 1 to 6 and 10 to 12, which suggests that the resistive films according to these Examples had the desired acid resistance.

TABLE 1

| | Resistive film | | | | | | Return loss | | resist Heatance | Acid resistance |
|---|---|---|---|---|---|---|---|---|---|---|
| | Composition | Ratio of volumetric flow rate of oxygen gas to volumetric flow rate of argon gas [%] | Thickness [nm] | Specific resistance [Ω·cm] | Hall mobility [cm$^2$/V·S] | Dielectric layer Material | Electrical conductor Material | Before reliability test | After reliability test at 125° C. for 1000 hours | Sheet resistance change rate ΔSh [%] | Sheet resistance change rate ΔSc [%] |
| Example 1 | ITO (SnO$_2$: 30 wt %) | 0.7 | 44 | 1.7 × 10$^{-3}$ | 15 | Acrylic | Al | AA | AA | 13 | 7 |
| Example 2 | ITO (SnO$_2$: 30 wt %) | 2.0 | 19 | 0.8 × 10$^{-3}$ | 31 | Acrylic | Al | AA | AA | 9 | 7 |
| Example 3 | ITO (SnO$_2$: 30 wt %) | 3.3 | 22 | 0.7 × 10$^{-3}$ | 46 | Acrylic | Al | AA | A | 17 | 6 |
| Example 4 | ITO (SnO$_2$: 50 wt %) | 2.0 | 90 | 4.1 × 10$^{-3}$ | 8 | Acrylic | Al | AA | AA | 12 | 1 |
| Example 5 | ITO (SnO$_2$: 50 wt %) | 3.3 | 36 | 1.3 × 10$^{-3}$ | 23 | Acrylic | Al | AA | AA | 6 | 0 |
| Example 6 | ITO (SnO$_2$: 50 wt %) | 4.7 | 26 | 1.0 × 10$^{-3}$ | 41 | Acrylic | Al | AA | A | 19 | 1 |
| Example 7 | ITO (SnO$_2$: 20 wt %) | 0.7 | 50 | 2.0 × 10$^{-3}$ | 10 | Acrylic | Al | AA | A | 25 | 270 |
| Example 8 | ITO (SnO$_2$: 20 wt %) | 2.0 | 22 | 0.8 × 10$^{-3}$ | 20 | Acrylic | Al | AA | AA | 9 | 250 |
| Example 9 | ITO (SnO$_2$: 20 wt %) | 4.7 | 20 | 0.7 × 10$^{-3}$ | 39 | Acrylic | Al | AA | A | 25 | 235 |
| Example 10 | ITO (SnO$_2$: 70 wt %) | 3.3 | 52 | 1.9 × 10$^{-3}$ | 20 | Acrylic | Al | AA | AA | 1 | 3 |
| Example 11 | ITO (SnO$_2$: 70 wt %) | 5.3 | 45 | 1.7 × 10$^{-3}$ | 31 | Acrylic | Al | AA | AA | 9 | 2 |
| Example 12 | ITO + SiO$_2$ (SnO$_2$: 30 wt %: SiO$_2$: 2.5 wt %) | 2.7 | 42 | 1.6 × 10$^{-3}$ | 21 | Acrylic | Al | AA | AA | 4 | 8 |
| Example 13 | ITO + SiO$_2$ (SnO$_2$: 15 wt %: SiO$_2$: 5 wt %) | 2.7 | 87 | 3.5 × 10$^{-3}$ | 17 | Acrylic | Al | AA | AA | 11 | 90 |
| Example 14 | ITO + TiO$_2$ (SnO$_2$ 15 wt %: TiO$_2$: 5 wt %) | 2.0 | 98 | 4.4 × 10$^{-3}$ | 15 | Acrylic | Al | A | A | 4 | 10 |
| Comparative Example 1 | ITO (SnO$_2$: 50 wt %) | 1.3 | 100 | 9.9 × 10$^{-3}$ | 4 | Acrylic | Al | X | — | — | — |
| Comparative Example 2 | ITO (SnO$_2$: 15 wt %) | 2.0 | 10 | 0.4 × 10$^{-3}$ | 31 | Acrylic | Al | AA | X | 110 | 650 |
| Comparative Example 3 | ITO (SnO$_2$: 50 wt %) | 1.3 | 210 | 8.0 × 10$^{-3}$ | 4 | Acrylic | Al | AA | X | 48 | 2 |
| Comparative Example 4 | ITO (SnO$_2$: 90 wt %) | 3.3 | 580 | 2.3 × 10$^{-2}$ | Unmeasurable | Acrylic | Al | X | — | — | — |

The invention claimed is:

1. An impedance matching film for a radio wave absorber, comprising:
    a mixture containing indium oxide and tin oxide and being a main component of the impedance matching film, the mixture having an amorphous structure, wherein
    the impedance matching film has a Hall mobility of 5 cm$^2$/(V·s) or more,
    the impedance matching film has a thickness of 16 nm or more and less than 100 nm,
    the impedance matching film has a sheet resistance of 200 to 800Ω/☐ and a content of the tin oxide is 20 mass % or more.

2. The impedance matching film according to claim 1, wherein the impedance matching film has a specific resistance of $0.5 \times 10^{-3}$ to $5.0 \times 10^{-3}$ Ω·cm.

3. The impedance matching film according to claim 1, wherein a content of the tin oxide is more than 40 mass %.

4. The impedance matching film according to claim 1, further comprising:
    an additive that comprises at least an atom different from an indium atom, a tin atom, and an oxygen atom.

5. An impedance matching film-attached film for a radio wave absorber, comprising:
    a substrate; and
    the impedance matching film according to claim 1.

6. A radio wave absorber, comprising:
    the impedance matching film according to claim 1;
    an electrical conductor that reflects a radio wave; and
    a dielectric layer disposed between the impedance matching film and the electrical conductor in a thickness direction of the impedance matching film.

7. The radio wave absorber according to claim 6, wherein the electrical conductor comprises indium tin oxide.

8. The radio wave absorber according to claim 6, wherein the electrical conductor comprises at least one selected from the group consisting of aluminum, copper, iron, an aluminum alloy, a copper alloy, and an iron alloy.

9. The radio wave absorber according to claim 6, wherein the dielectric layer has a relative permittivity of 2.0 to 20.0.

10. The radio wave absorber according to claim 6, wherein the dielectric layer comprises at least one polymer selected from the group consisting of ethylene-vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer.

11. The radio wave absorber according to claim 6, further comprising:
    an adhesive layer, wherein
    the electrical conductor is disposed between the dielectric layer and the adhesive layer.

12. A laminate for a radio wave absorber, comprising:
    the impedance matching film according to claim 1; and
    a dielectric layer disposed in contact with the impedance matching film in a thickness direction of the impedance matching film.

* * * * *